United States Patent
Lee et al.

(10) Patent No.: US 8,176,912 B2
(45) Date of Patent: May 15, 2012

(54) LIGHT-CONDENSING DEVICE AND METHOD OF FABRICATING THE SAME

(75) Inventors: ChaBum Lee, Gwangju (KR); Sun-Kyu Lee, Gwangju (KR); JaeYoung Joo, Gwangju (KR); Do-Kyun Woo, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 554 days.

(21) Appl. No.: 12/399,395

(22) Filed: Mar. 6, 2009

(65) Prior Publication Data

US 2009/0225423 A1    Sep. 10, 2009

(30) Foreign Application Priority Data

Mar. 6, 2008   (KR) .................. 10-2008-0020910

(51) Int. Cl.
| | |
|---|---|
| F24J 2/08 | (2006.01) |
| H01L 31/042 | (2006.01) |
| H01L 31/00 | (2006.01) |
| H02N 6/00 | (2006.01) |
| G02B 27/44 | (2006.01) |

(52) U.S. Cl. ......... 126/698; 136/246; 136/259; 359/565

(58) Field of Classification Search .................. 359/565, 359/566, 569, 576, 571; 126/698; 136/246, 136/259
See application file for complete search history.

(56) References Cited

U.S. PATENT DOCUMENTS

| | | | | |
|---|---|---|---|---|
| 2003/0227685 | A1* | 12/2003 | Tsukada | 359/569 |
| 2008/0037126 | A1* | 2/2008 | Kitamura et al. | 359/569 |
| 2009/0231711 | A1* | 9/2009 | Ohmura | 359/569 |

* cited by examiner

Primary Examiner — Alessandro Amari
Assistant Examiner — Kimberly N Kakalec
(74) Attorney, Agent, or Firm — Occhiuti Rohlicek & Tsao LLP (57) ABSTRACT

A light-condensing device and a method of fabricating the same are provided. The light-condensing device includes a central block, a pair of vertical diffraction grating blocks respectively located left and right of the central block, and a pair of horizontal diffraction grating blocks respectively located above and below the central block. The vertical diffraction grating blocks include parallel vertical diffraction gratings in the form of lines extending in the direction of a vertical axis, and the horizontal diffraction grating blocks include parallel horizontal diffraction gratings in the form of lines extending in the direction of a horizontal axis.

6 Claims, 11 Drawing Sheets

LIGHT-CONDENSING DEVICE AND METHOD OF FABRICATING THE SAME

CROSS-REFERENCE TO RELATED APPLICATION

This application claims the benefit of Korean Patent Application No. 10-2008-0020910, filed on Mar. 6, 2008, the disclosure of which is hereby incorporated herein by reference in its entirety.

BACKGROUND OF THE INVENTION

1. Field of the Invention

The present invention relates to an optical device and a method of fabricating the same, and more particularly, to a light-condensing device and a method of fabricating the same.

2. Description of the Related Art

A Fresnel lens, ordinarily used as a light-condensing device, performs the same function as a convex lens but has a structure with reduced thickness, wherein a convex lens' surface is partitioned into concentric annular sections and arranged in a flat plane. The partitioned sections are referred to as Fresnel zones. At least one Fresnel zone located in the center is spherical.

In order to fabricate such a Fresnel lens, a mold having a profile corresponding to the Fresnel zones is cut from a mold plate using a diamond bite, and then the Fresnel lens is molded using the mold.

However, when using such a method, there is a limit to reducing the size of the Fresnel lens. If semiconductor technology was used to form the Fresnel lens, the size of the lens could be reduced, but it could be extremely difficult to form the spherical Fresnel zone using semiconductor processing technology.

SUMMARY OF THE INVENTION

The present invention is directed to a miniature light-condensing device that can be fabricated using semiconductor processing technology, and a method of fabricating the device.

According to one aspect of the present invention, a light-condensing device is provided. The light-condensing device includes a central block, a pair of vertical diffraction grating blocks respectively located left and right of the central block, and a pair of horizontal diffraction grating blocks respectively located above and below the central block. The vertical diffraction grating blocks include parallel vertical diffraction gratings in the form of lines extending in the direction of a vertical axis, and the horizontal diffraction grating blocks include parallel horizontal diffraction gratings in the form of lines extending in the direction of a horizontal axis.

According to another aspect of the present invention, a method of fabricating a light-condensing device is provided. First, a molding substrate including a central region, and an upper region, a lower region, a left side region, and a right side region respectively located above, below, left, and right of the central region is provided. Parallel vertical trench lines are formed inside the left and right side regions, and parallel horizontal trench lines are formed inside the upper and lower regions. By providing optical resin on the molding substrate including the trench lines, a light-condensing device having a central block, a pair of vertical diffraction grating blocks respectively located left and right of the central block and including parallel vertical diffraction gratings in the form of lines extending in the direction of a vertical axis, and a pair of horizontal diffraction grating blocks respectively located above and below the central block and including parallel horizontal diffraction gratings in the form of lines extending in the direction of a horizontal axis, is formed.

BRIEF DESCRIPTION OF THE DRAWINGS

These and/or other objects, aspects and advantages of the invention will become apparent and more readily appreciated from the following description of exemplary embodiments, taken in conjunction with the accompanying drawings, of which.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in many different forms and should not be construed as limited to the exemplary embodiments set forth herein. Whenever elements appear in the drawings or are mentioned in the specification, they are always denoted by the same reference numerals.

It will be understood that, although the terms first, second, A, B, etc. may be used herein to denote various elements, these elements are not limited by these terms. These terms are only used to distinguish one element from another. For example, a first element could be termed a second element, and, similarly, a second element could be termed a first element, without departing from the scope of the exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, numbers, steps, operations, elements and/or components, but do not preclude the presence or addition of one or more other features, numbers, steps, operations, elements, components and/or groups thereof.

Unless otherwise defined, all terms (including technical and scientific terms) used herein have the same meanings as commonly understood by one of ordinary skill in the art to which this invention pertains. It will be further understood that terms defined in common dictionaries should be interpreted within the context of the relevant art and not in an idealized or overly formal sense unless expressly so defined herein.

Figure 1:
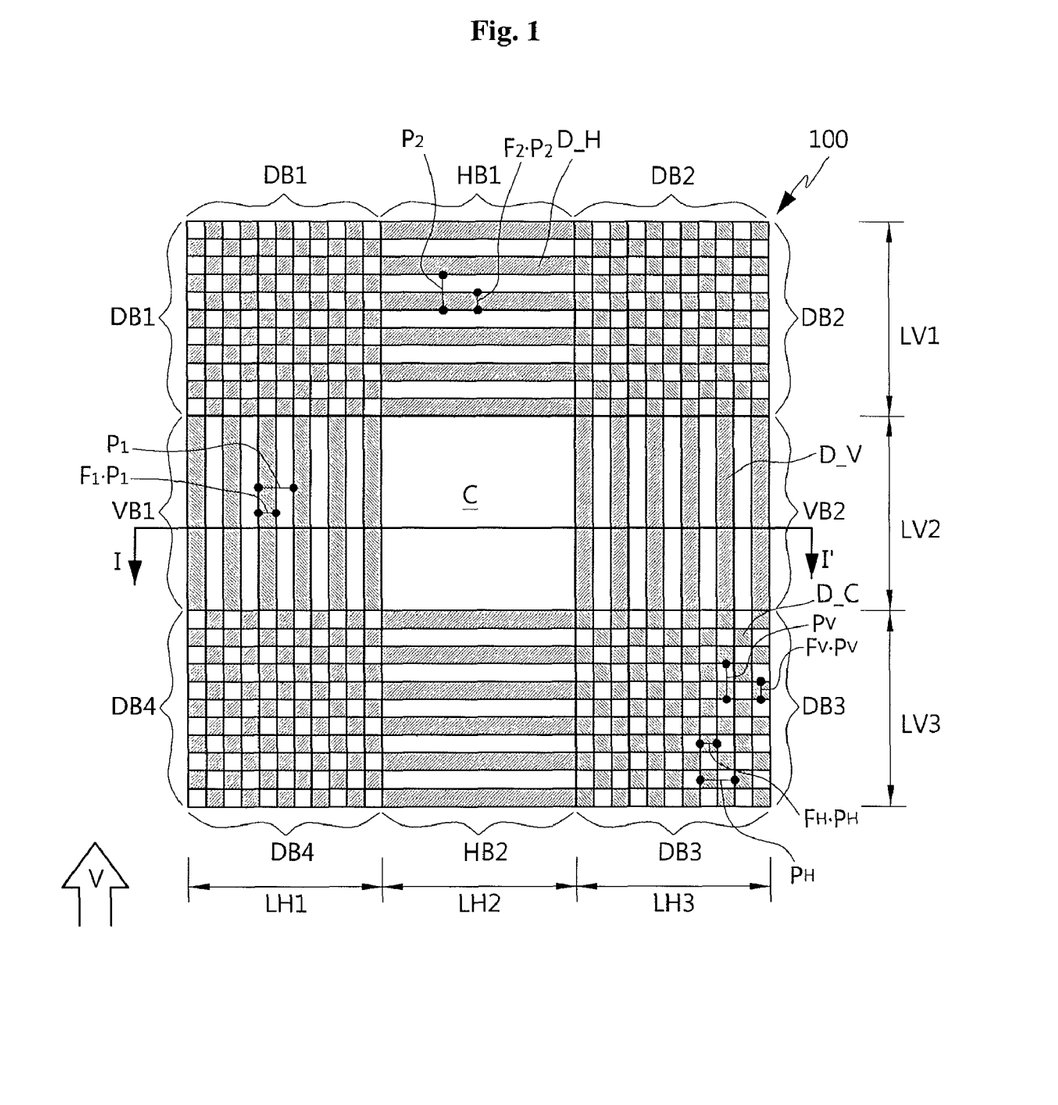
FIG. 1 is a plan view of a light-condensing device according to an exemplary embodiment of the present invention.
Figure 2:
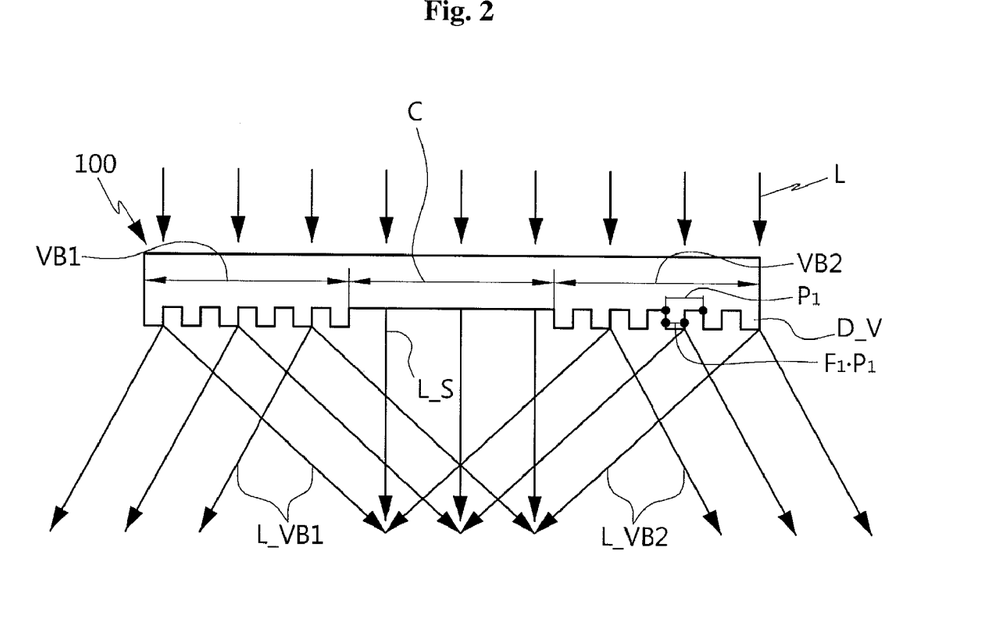
FIG. 2 is a cross-sectional view along line I-I' in FIG. 1.

FIG. 1 is a plan view of a light-condensing device according to an exemplary embodiment of the present invention. FIG. 2 is a cross-sectional view taken along line I-I' of FIG. 1.

Referring to FIGS. 1 and 2, a light-condensing device 100 includes a central block C, first and second vertical diffraction grating blocks VB1 and VB2 respectively located left and right of the central block C, and first and second horizontal diffraction grating blocks HB1 and HB2 respectively located above and below the central block C. The material of the light-condensing device 100 may be glass, polymethylmethacrylate (PMMA), or polycarbonate.

The central block C may be a region in which a diffraction grating is not formed.

The pair of vertical diffraction grating blocks VB1 and VB2 include a plurality of vertical diffraction gratings D_V parallel to border lines between the vertical diffraction grating blocks VB1 and VB2 and the central block C. The vertical diffraction gratings D_V may be in the form of parallel lines, and sidewalls of the vertical diffraction gratings D_V may be substantially vertical with respect to a top surface of the vertical diffraction gratings D_V. The vertical diffraction gratings D_V are arranged with a first period $P_1$, and a width of each of the vertical diffraction gratings D_V may be expressed as the first period $P_1$×a first fill factor $F_1$. Here, fill factor means the ratio of the width of the diffraction grating to its period. As an example, the first fill factor $F_1$ may be 0.5.

The pair of horizontal diffraction grating blocks HB1 and HB2 include a plurality of horizontal diffraction gratings D_H parallel to border lines between the horizontal diffraction grating blocks HB1 and HB2 and the central block C. The horizontal diffraction gratings D_H may also be in the form of parallel lines, and sidewalls of the horizontal diffraction gratings D_H may be substantially vertical with respect to a top surface of the horizontal diffraction gratings D_H. The horizontal diffraction gratings D_H are arranged with a second period $P_2$, and a width of each of the horizontal diffraction gratings D_H may be expressed as the second period $P_2$×a second fill factor $F_2$. As an example, the second period $P_2$ may be the same as the first period $P_1$, and second fill factor $F_2$ may be 0.5.

In addition, diagonal diffraction grating blocks DB1, DB2, DB3 and DB4 may be located adjacent to four corners of the central block C. The diagonal diffraction grating blocks DB1, DB2, DB3 and DB4 may include a first diagonal diffraction grating block DB1 located between the first vertical and first horizontal diffraction grating blocks VB1 and HB1, a second diagonal diffraction grating block DB2 located between the first horizontal and second vertical diffraction grating blocks HB1 and VB2, a third diagonal diffraction grating block DB3 located between the second vertical and second horizontal diffraction grating blocks VB2 and HB2, and a fourth diagonal diffraction grating block DB4 located between the second horizontal and first vertical diffraction grating blocks HB2 and VB1.

Each of the diagonal diffraction grating blocks DB1, DB2, DB3 and DB4 may include rectangular hexahedron diffraction gratings D_C arranged diagonally adjacent to one another. The cuboid diffraction gratings D_C may have the form of cubes, cuboids, or frustums of rectangular pyramids. At least some of the corners of the rectangular hexahedron diffraction gratings D_C arranged diagonally adjacent to one another may contact one another.

The rectangular hexahedron diffraction gratings D_C are arranged in the direction of a horizontal axis H with a third period $P_H$, and in the direction of a vertical axis V with a fourth period $P_V$. Also, the width of each of the rectangular hexahedron diffraction gratings D_C in the horizontal axis H direction may be expressed as a third period $P_H$×a third fill factor $F_H$, and the width of each of the rectangular hexahedron diffraction gratings D_C in the vertical axis V direction may be expressed as a fourth period $P_V$×a fourth fill factor $F_V$. As an example, the width of each of the rectangular hexahedron diffraction gratings D_C in the horizontal direction ($P_H \cdot F_H$) and in the vertical direction ($P_V \cdot F_V$) may be the same. In other words, the top surfaces of the rectangular hexahedron diffraction gratings D_C may be squares. Moving on, the third period $P_H$ and the fourth period $P_V$ may be the same, and the third and fourth fill factors $F_H$ and $F_V$ may each be 0.5.

As an example, the light-condensing device 100 may be in the form of a 3×3 matrix. In this case, horizontal axis H direction widths of the blocks arranged in the form of a 3×3 matrix may be first through third horizontal widths LH1, LH2 and LH3, and vertical axis V direction widths of the blocks may be first through third vertical widths LV1, LV2 and LV3. As an example, each of the blocks may have the form of a square. In this case, all of the first through third horizontal widths LH1, LH2 and LH3 and the first through third vertical widths LV1, LV2 and LV3 may be the same.

Figure 3:
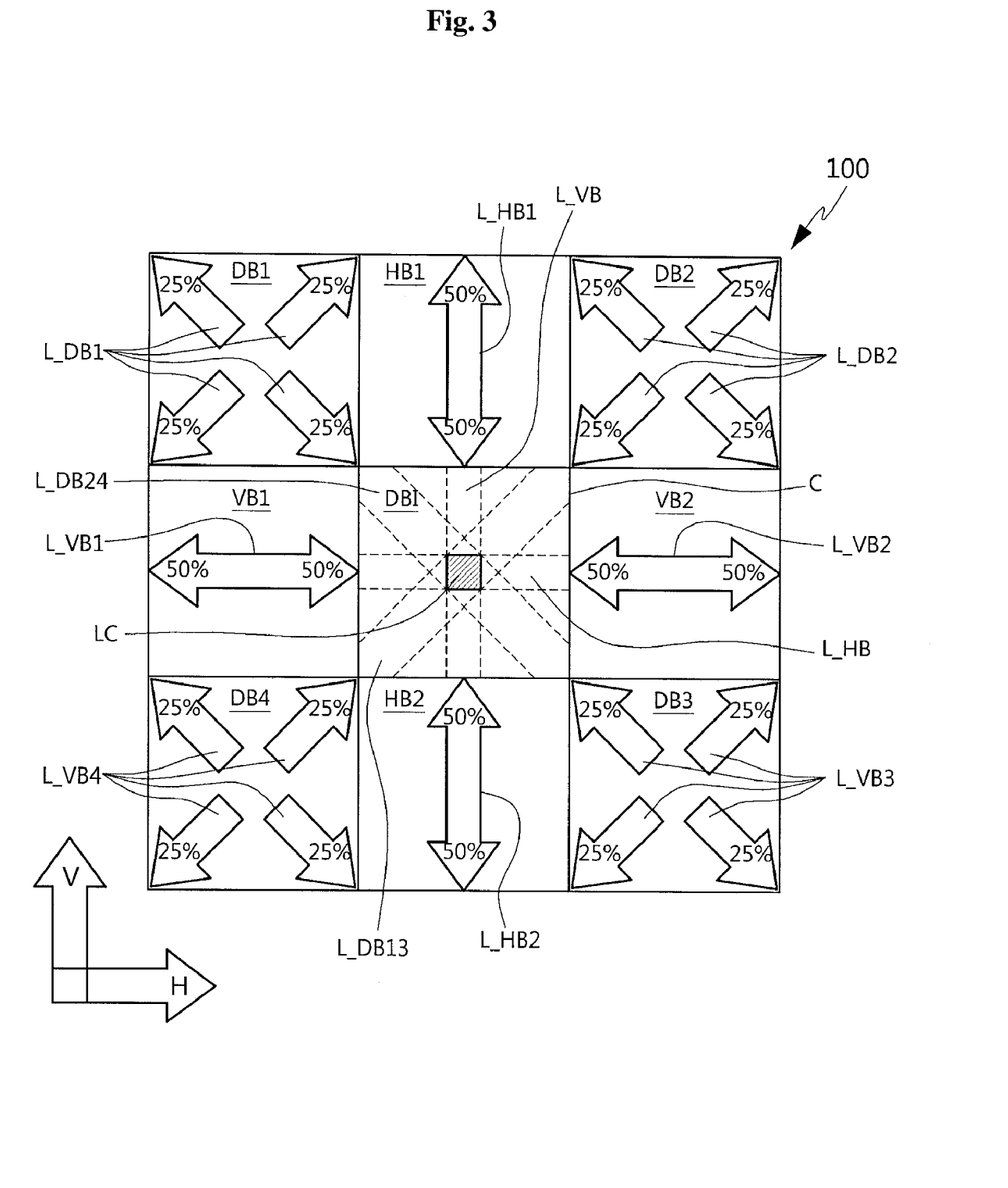
FIG. 3 is a schematic diagram of a method of condensing light using a light-condensing device according to an exemplary embodiment of the present invention.

FIG. 3 is a schematic diagram showing a method of concentrating light using a light-condensing device according to an exemplary embodiment of the present invention.

Referring to FIGS. 2 and 3, light L is incident on a front facet of the light-condensing device 100. As an example, the incident light L may be incident normal to the front facet of the light-condensing device 100.

The light L incident on the central block C is emitted from a back facet of the light-condensing device in the same direction as the propagation direction of the incident light L. Accordingly, when the incident light L is normal to the front facet of the light-condensing device 100, emitted light L_S emitted from the central block C may likewise be normal to the back facet of the light-condensing device 100.

Light incident on the first vertical diffraction grating block VB1 is diffracted from the back facet of the light-condensing device 100 to form first light beams L_VB1 diverging in either direction with the vertical axis V at the center. Also, light incident on the second vertical diffraction grating block VB2 is diffracted from the back facet of the light-condensing device 100 to form first light beams L_VB2 diverging in either direction with the vertical axis V at the center. The first light beams L_VB1 and L_VB2 undergo constructive interference below the central block C to form a vertical light-condensing region L_VB extending in the vertical axis V direction.

Similarly, light incident on each of the first and second horizontal diffraction grating blocks HB1 and HB2 is diffracted from the back facet of the light-condensing device 100 to form first light beams L_VB1 and L_HB2 diverging in either direction with the horizontal axis H at the center. The first light beams L_HB1 and L_HB2 undergo constructive interference below the central block C to form a horizontal light-condensing region L_HB extending in the horizontal axis H direction.

Also, light incident on each of the first through fourth diagonal diffraction grating blocks DB1, DB2, DB3 and DB4 is diffracted from the back facet of the light-condensing device 100 to form first light beams L_DB1, L_DB2, L_DB3 and L_DB4 diverging in four diagonal directions. The first and third light beams L_DB1 and L_DB3 diffracted in the first and third diagonal diffraction grating blocks DB1 and DB3 undergo constructive interference below the central block C to form a first diagonal light-condensing region L_DB13 extending in a first diagonal direction. And, the second and fourth light beams L_DB2 and L_DB4 diffracted in the second and fourth diagonal diffraction grating blocks DB2 and DB4 undergo constructive interference below the central block C to form a second diagonal light-condensing region L_DB24 extending in a second diagonal direction.

The emitted light L_S emitted from the central block C, the vertical light-condensing region L_VB, the horizontal light-condensing region L_HB, the first diagonal light-condensing region L_DB13 and the second diagonal light-condensing region L_DB24 are all superimposed upon one another below the central block C to form a central light-condensing region LC. However, the central light-condensing region LC may be formed even when diffraction gratings are not formed in the first through fourth diagonal diffraction grating blocks DB1, DB2, DB3 and DB4. Only, the intensity of the light condensed in the central light-condensing region LC is lower.

To aid in understanding, boundaries of the light-condensing regions L_VB, L_HB, L_DB13, L_DB24 and LC shown in the drawings only show the case of light-condensing efficiency exceeding a fixed level, and light is not only emitted inside the light-condensing regions L_VB, L_HB, L_DB13, L_DB24 and LC. To elaborate, light-condensing efficiency decreases outward from the light-condensing regions L_VB, L_HB, L_DB13, L_DB24 and LC.

Since such a light-condensing device 100 includes the diffraction gratings in the form of lines or rectangular hexahedrons, it can be formed using semiconductor manufacturing processes as described below. Accordingly, the integration of the light-condensing device can be drastically improved.

Figure 4:
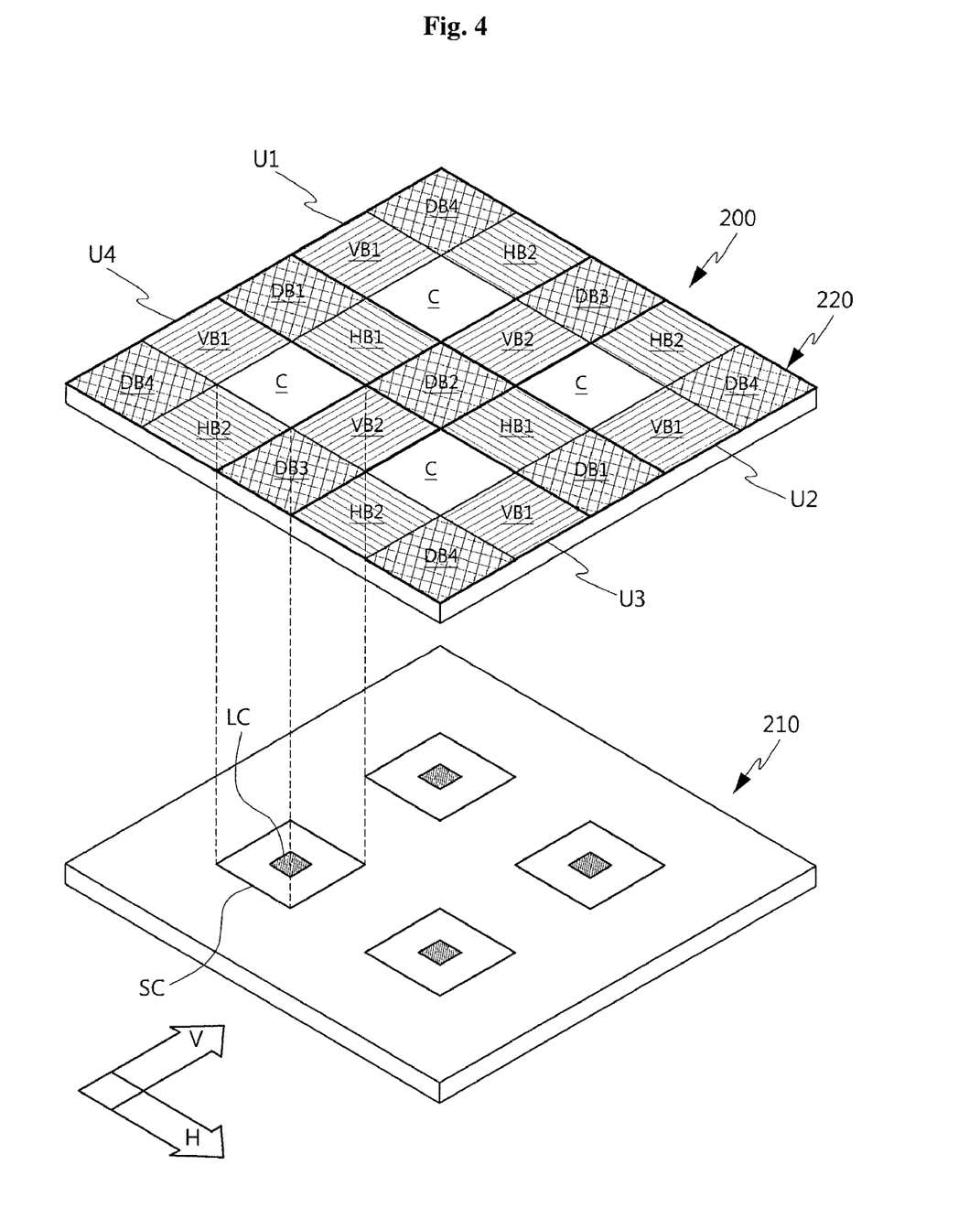
FIG. 4 is a schematic diagram of a solar cell module according to an exemplary embodiment of the present invention.

FIG. 4 is a schematic diagram of solar cell module according to an exemplary embodiment of the present invention.

Referring to FIG. 4, a solar cell module 200 includes a solar cell array substrate 210 on which solar cells SC are arranged, and a light-condensing device array substrate 220 located on the solar cell array substrate 210.

The light-condensing device array substrate 220 includes a plurality of unit light-condensing devices U1, U2, U3 and U4. Each of the unit light concentrating devices U1, U2, U3 and U4 is the same as the light-condensing device described with reference to FIGS. 1 through 3. However, a pair of unit light-condensing devices adjacent in the horizontal axis H direction (U1 & U2 or U3 & U4) share one vertical diffraction grating region (VB2 or VB1), a pair of unit light-condensing devices adjacent in the vertical axis V direction (U1 & U4 or U2 & U3) share one horizontal diffraction grating region (HB1 or HB2), and four unit light-condensing devices U1, U2, U3 and U4 adjacent in the horizontal axis H and vertical axis V directions share one diagonal diffraction grating region DB1, DB2, DB3 or DB4.

The solar cells SC are arranged corresponding to central blocks C of the light-condensing device array substrate 220.

Similar to the above description with reference to FIG. 3, the unit light-condensing devices U1, U2, U3 and U4 can perform light-condensing LC on respectively corresponding solar cells SC. As mentioned above, since the light-condensing device array substrate 220 includes the diffraction gratings in the form of lines or rectangular hexahedrons, it can be formed using semiconductor manufacturing processes, and thus the integration of the light-condensing device array substrate 220 can be drastically improved. As a result, the integration density of the solar cell module 200 can also be improved.

FIGS. 5A to 5E are cross-sectional views illustrating a method of fabricating a light-condensing device according to an exemplary embodiment of the present invention.

Figure 5A:
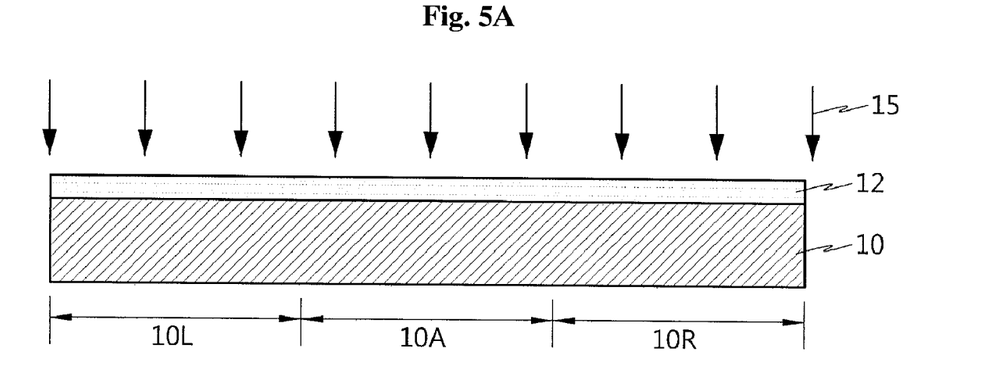
FIGS. 5A to 5E are cross-sectional views illustrating a method of fabricating a light-condensing device according to an exemplary embodiment of the present invention.

Referring to FIG. 5A, a resist layer 12 is formed on a molding substrate 10. The molding substrate 10 may be a silicon substrate. As an example, the silicon substrate may be an n-type substrate having a size of 20 mm×20 mm and a thickness of 500 μm. The molding substrate 10 may include a central region 10A, and an upper region (not shown), a lower region (not shown), a left side region 10L and a right side region 10R respectively located above, below, left, and right of the central region 10A. Moreover, the molding substrate 10 may further include middle regions (not shown) adjacent to 4 corners of the central region 10A. The central region 10A, the upper region, the lower region, the left side region 10L, the right side region 10R, and the middle regions may respectively correspond to the central block C, the first horizontal diffraction grating block HB1, the second horizontal diffraction grating block HB2, the first vertical diffraction grating block VB1, the second vertical diffraction grating block VB2, and the diagonal diffraction grating blocks DB1, DB2, DB3 and DB4 shown in FIG. 1.

The molding substrate 10 including the resist layer 12 is irradiated with a patterned beam 15. The beam 15 may be an electron beam (e-beam), in which case the resist layer 12 may appropriate for an e-beam. In this case, the e-beam may be radiated using direct writing without a photo mask.

The e-beam resist layer may be a ZEP 520 (Nippon Zeon, Co.) having a thickness of 1000 nm, and after forming the resist layer 12, it may be pre-baked for three minutes at 180□. Also, an accelerating voltage, beam current, and dose of the e-beam may be 30 kV, 10 pA and 56 μC/cm², respectively.

Figure 5B:
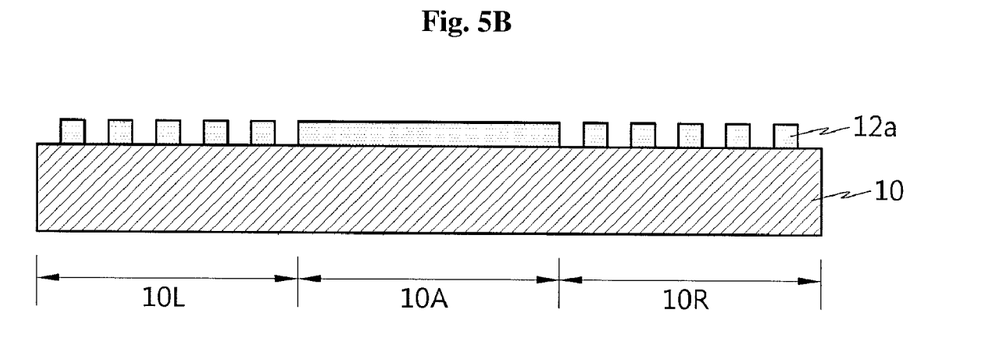

Referring to FIG. 5B, if the resist layer 12 is developed after irradiation by the beam 15, a resist pattern 12a is formed on the molding substrate 10. The developing may be performed by immersing the resist layer 12 in ZEP 520 developing solution for 5 minutes, and washing it for 30 seconds using methylethylketone solution. Afterwards, the resist pattern 12a may be post-baked for 3 minutes at 110 □.

Figure 5C:
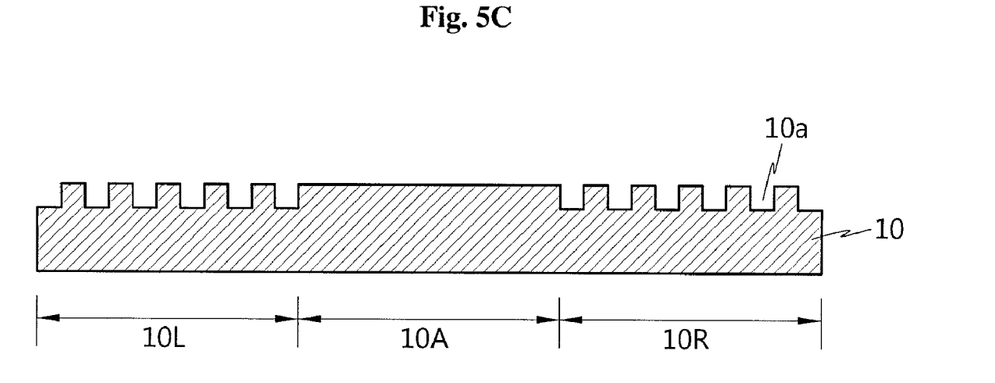

Referring to FIG. 5C, the molding substrate 10 is etched using the resist pattern 12a as a mask. As a result, molding patterns 10a having trenches are formed in the molding substrate 10. The molding patterns 10a may be parallel vertical trench lines in the left and right side regions 10L and 10R, parallel horizontal trench lines (not shown) in the upper and lower regions, or rectangular hexahedron trenches (not shown) arranged diagonally adjacent in the middle regions. The vertical and horizontal trench lines may respectively correspond to the vertical and horizontal diffraction gratings D_V and D_H of FIG. 1, and the rectangular hexahedron trenches may be formed to correspond to the rectangular hexahedron diffraction gratings D_C of FIG. 1.

The molding substrate 10 may be etched using an anisotropic etching method. More specifically, the molding substrate 10 may be etched using a high-energy neutral particle beam. The high-energy neutral particle beam refers to neutral particles having higher-than-normal kinetic energy at room temperature, i.e., high-energy neutral particles, and flowing in one direction in the form of a beam. Such a high-energy neutral particle beam has exceptional directivity, etching selectivity of the molding substrate 10 with respect to the resist patterns 12a is close to 1:1, and anisotropic etching can be performed efficiently. The high-energy neutral particle beam may be a fast atomic beam (FAB). As an example, FAB etching may be performed for 30 minutes at 21 nm/min using a FAB600ML (ABARA, Co.).

Figure 5D:
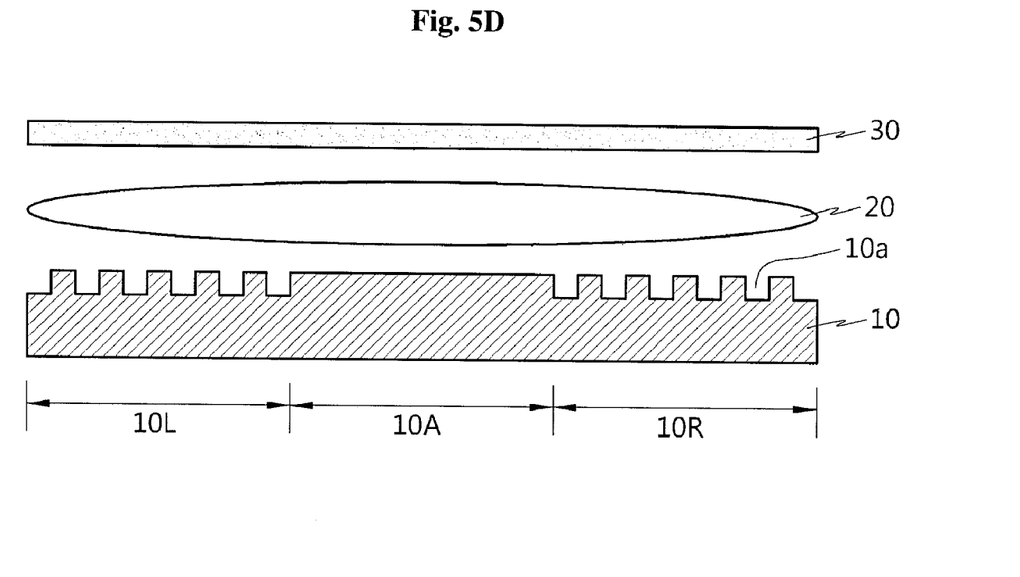

Referring to FIG. 5D, optical resin 20 is deposited on the molding substrate 10 including the molding patterns 10a, and a pressure panel 30 is disposed on the optical resin 20. The optical resin 20 may be polymethylmetacrylate (PMMA) or polycarbonate resin.

Figure 5E:
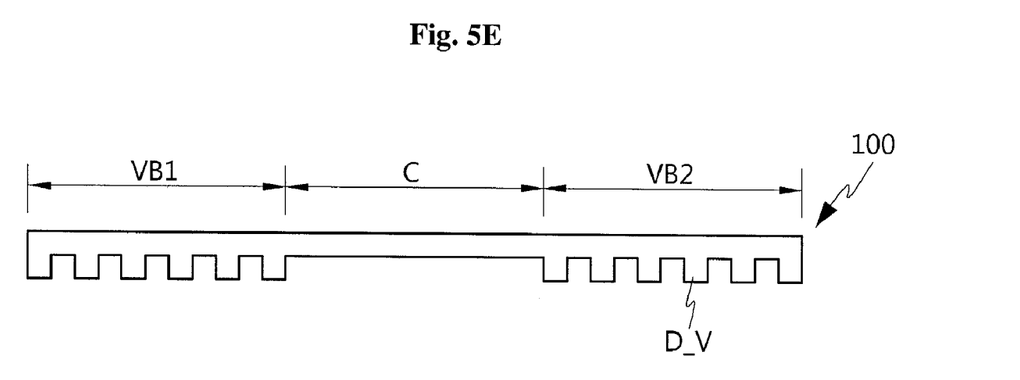

Referring to FIG. 5E, a light-condensing device 100, that is, a molded optical resin layer is formed by applying pressure to the pressure panel 30 in the direction of the molding substrate 10. In this way, the light-condensing device 100 may be reproduced using a hot embossing technique.

Figure 6A:
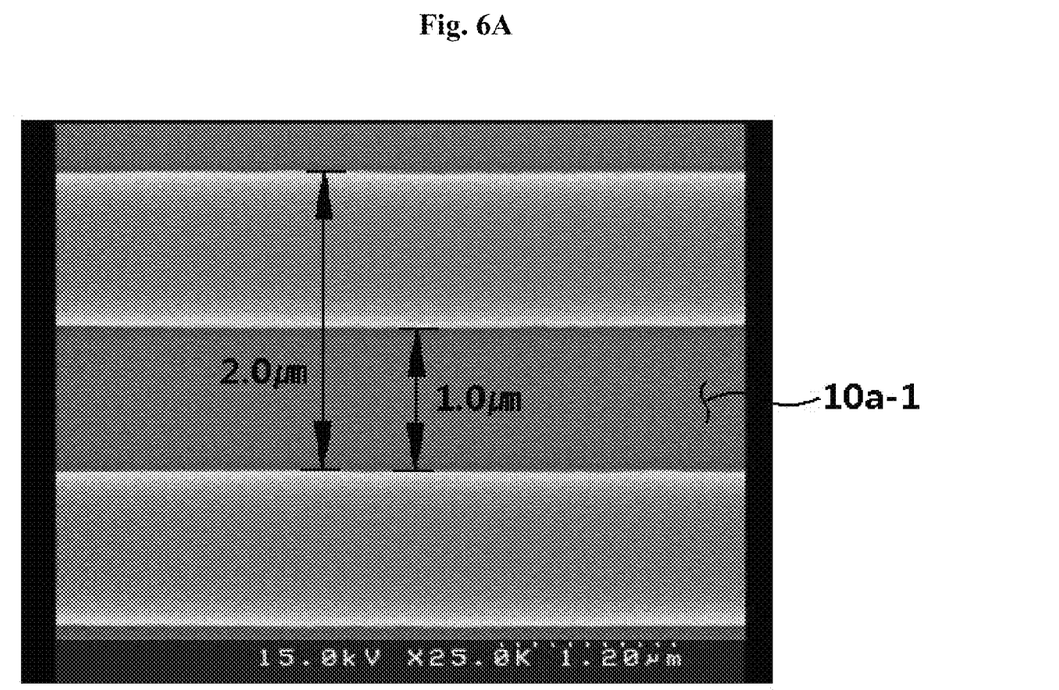
FIGS. 6A and 6B are scanning electron microscope (SEM) photographs of molding patterns.
Figure 6B:
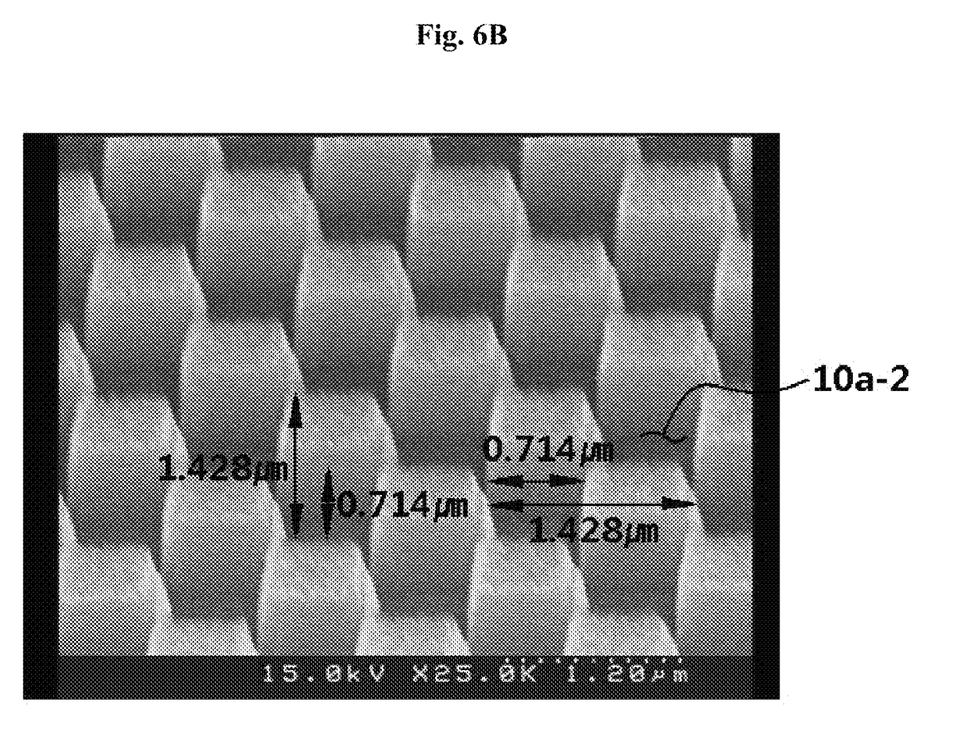

FIGS. 6A and 6B are scanning electron microscope (SEM) photographs of molding patterns.

Referring to FIG. 6A, it can be seen that parallel trench lines 10a_1 are formed. It can be seen that the trench lines 10a_1 have a width of 1.0 µm and are arranged with a period of 2.0 µm.

Referring to FIG. 6B, it can be seen that rectangular hexahedron trenches 10a_2 are formed in a diagonally adjacent arrangement. It can be seen that the rectangular hexahedron trenches 10a_2 have a width of 0.714 µm and a period of 1.428 µm in the horizontal axis direction, and a width of 0.714 µm and a period of 1.428 µm in the vertical axis direction.

A method of calculating the depth and angle of diffraction of the diffraction gratings of a light-condensing device according to an exemplary embodiment of the present invention will be described below.

The depth d of a diffraction grating can be calculated using the optical and geometrical conditions listed in Table 1 below.

TABLE 1

| Diffraction Grating Period (P) | Fill Factor (F) | Refractive Index Ratio (n1/n0) | Wavelength of Incident Light (λ) |
| --- | --- | --- | --- |
| 2.0 µm | 0.5 | 1.5 | 0.65 µm | n1: Refractive Index of PMMA Substrate,
n0: Refractive Index of Air

Specifically, transmission efficiency is calculated as a function of diffraction grating depth by scalar Fourier transform and vector rigorous coupled-wave analysis (RCWA) using the conditions in Table 1. The transmission efficiency according to diffraction grating depth is shown in FIG. 7.

Figure 7:
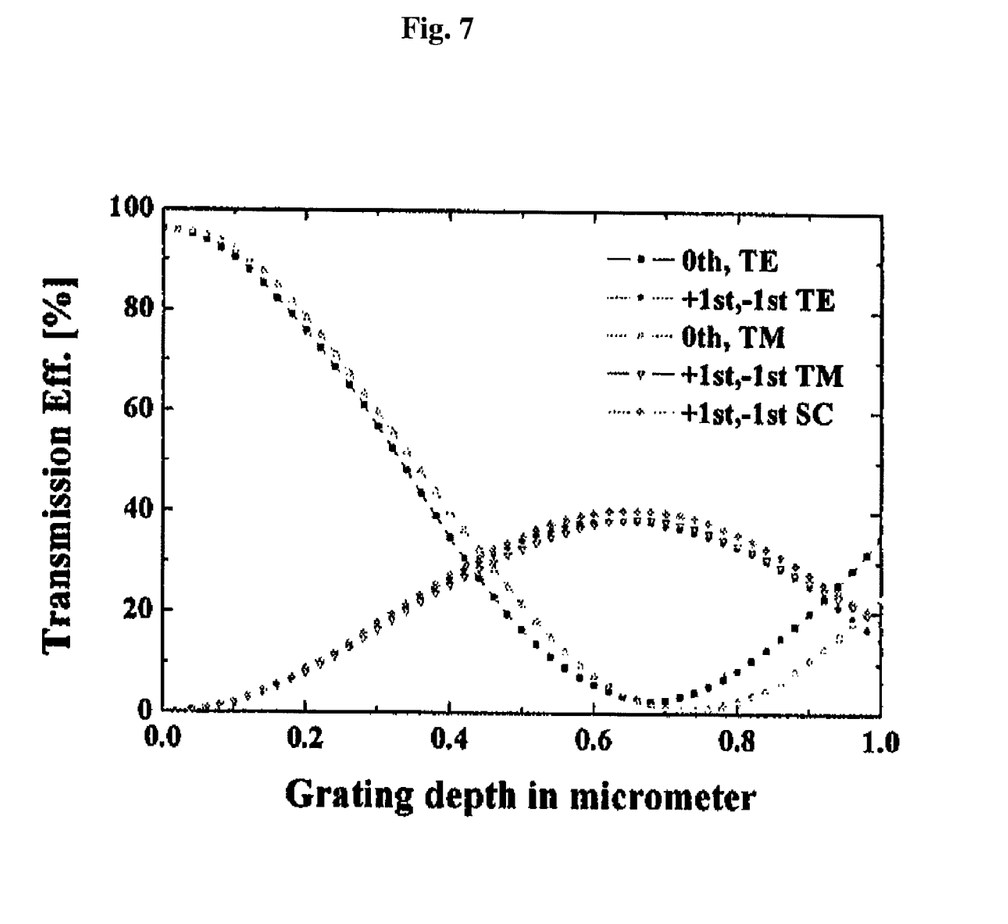
FIG. 7 is a graph of transmission efficiency versus diffraction grating depth.

Referring to FIG. 7, it can be seen that a first maximum diffraction efficiency according to a scalar analysis is calculated to be 40.5% at a depth of 0.65 µm (+1 st, −1 st SC), and a first maximum diffraction efficiency according to a vector analysis is calculated to be 38.3% in a transverse electric (TE) mode at a depth of 0.63 µm (+1 st, −1 st TE) and 38.7% in a transverse magnetic (TM) mode at a depth of 0.66 µm (+1 st, −1 st TM). If the slight differences in depth are ignored, the diffraction grating depth d may be set at 0.65 µm.

Angle of diffraction can be calculated using the optical and geometrical conditions listed in Table 2 below.

TABLE 2

| | Diffraction Grating Period | Fill Factor (F) | Diffraction Grating Depth (d) | Refractive Index Ratio (n1/n0) | Wavelength of Incident Light (λ) |
| --- | --- | --- | --- | --- | --- |
| Horizontal & Vertical Diffraction Gratings | 2.0 µm ($P_1$ & $P_2$) | 0.5 | 0.65 µm | 1.5 | 0.65 µm |
| Rectangular Hexahedron Diffraction Gratings | 1.428 µm ($P_V$ & $P_H$) | 0.5 | 0.65 µm | | |

Remarks
n1: Refractive Index of PMMA Substrate,
n0: Refractive Index of Air

Figure 8A:
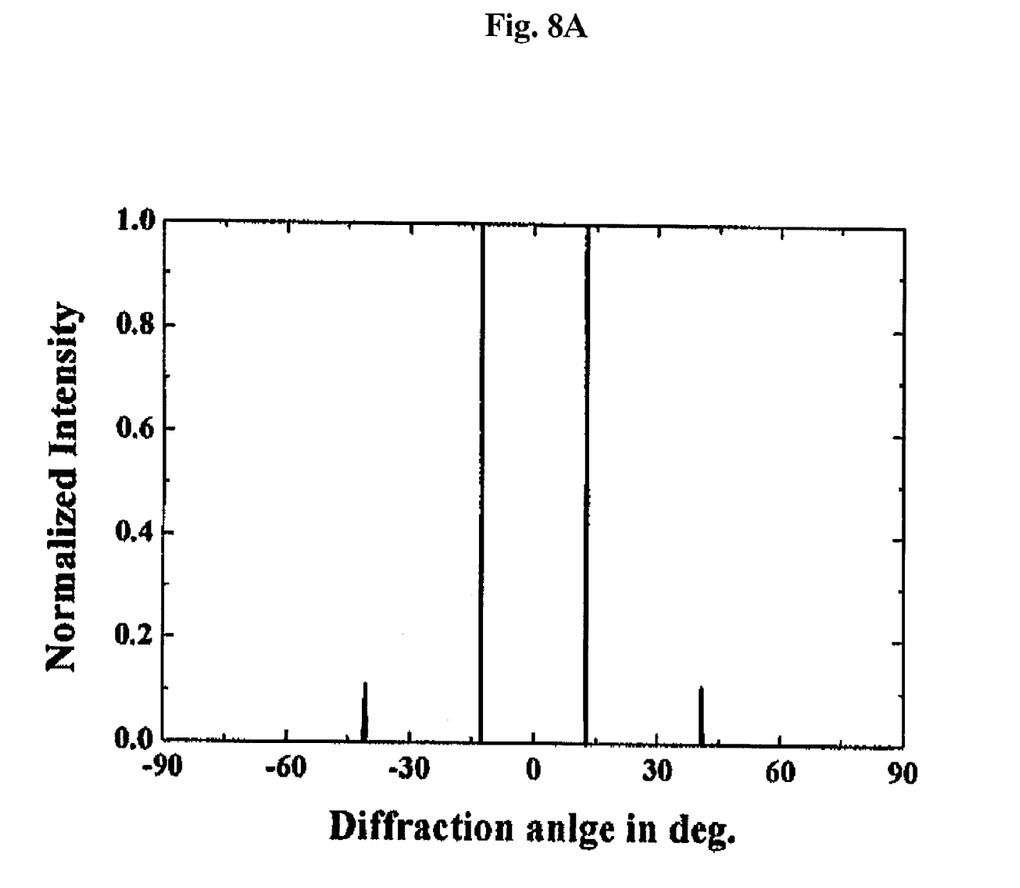
FIGS. 8A and 8B are graphs of normalized diffraction intensity versus diffraction angle.
Figure 8B:
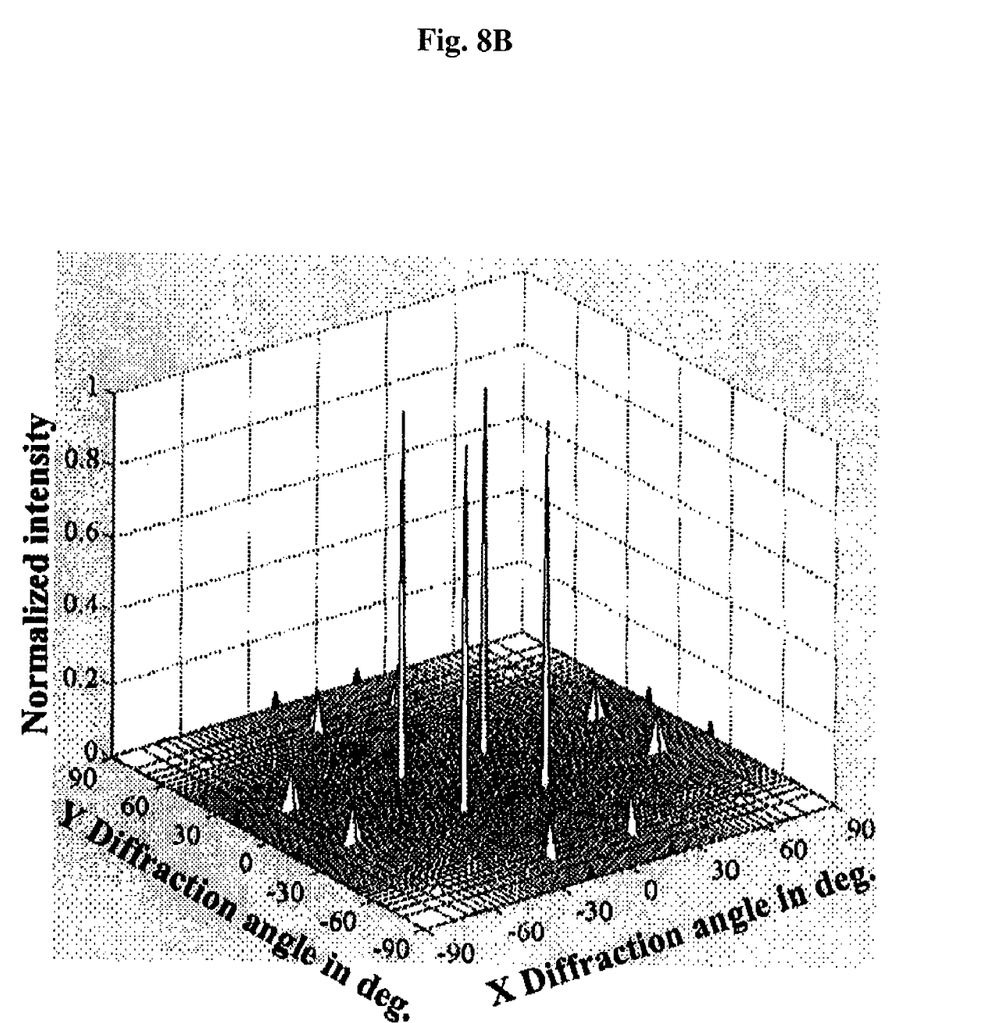

Specifically, normalized diffraction intensity as a function of diffraction angle is calculated for the horizontal and vertical diffraction gratings and the rectangular hexahedron diffraction gratings using the conditions of Table 2, and the results are shown in FIGS. 8A and 8B. Referring to FIG. 8A, it can be seen that the horizontal and vertical diffraction gratings produce maximum diffraction intensity at diffraction angles of ±12.6. Also, referring to FIG. 8B, it can be seen that the cubic diffraction gratings produce maximum diffraction intensity at diffraction angles of (±17.7°, ±17.7°).

A focal distance calculated using these diffraction angles is 448 µm.

According to the present invention, a light-condensing device can include diffraction gratings in the form of lines and can be formed by using semiconductor manufacturing processes. Accordingly, integration of the light-condensing device can be drastically improved.

While exemplary embodiments of the present invention have been shown and described, it will be appreciated by those skilled in the art that various changes can be made to the described exemplary embodiments without departing from the spirit and scope of the invention defined by the claims and their equivalents.

What is claimed is:

1. A solar cell module comprising:
   a solar cell array substrate on which a plurality of solar cells are arranged; and
   a light-condensing device array substrate located on the solar cell array substrate;
   wherein the light condensing device array substrate includes a plurality of unit light-condensing devices,
   wherein each unit light-condensing device includes:
      a central block;
      a pair of vertical diffraction grating blocks respectively located left and right of the central block, and comprising parallel vertical diffraction gratings in the form of lines extending in the direction of a vertical axis; and
      a pair of horizontal diffraction grating blocks respectively located above and below the central block, and comprising parallel horizontal diffraction gratings in the form of lines extending in the direction of a horizontal axis,
   wherein a pair of the plurality of unit light-condensing devices adjacent in the horizontal axis share the vertical diffraction grating block, and a pair of the plurality of unit light-condensing devices adjacent in the vertical axis share the horizontal diffraction grating block, and
   wherein a center of each solar cell is aligned with the central block of a corresponding one of the unit light-condensing devices.

2. The solar cell module according to claim 1,
   wherein the unit light-condensing device further comprises diagonal diffraction grating blocks located adjacent to four corner of the central block and comprising rectangular hexahedron diffraction gratings, and four unit light-condensing devices adjacent in the horizontal axis and vertical axis direction share one diagonal diffraction grating block, wherein a light incident on each of the diagonal diffraction is diffracted in four diagonal direction.

3. The solar cell module according to claim 2, wherein each of the diagonal diffraction grating blocks includes rectangular hexahedron diffraction gratings arranged diagonally.

4. The solar cell module according to claim 3, wherein the material of the light condensing device is glass, polymethylmethacrylate(PMMA) or polycarbonate.

5. The solar cell module according to claim 3, a width of the rectangular hexahedron diffraction gratings is narrower than a width of the parallel vertical diffraction gratings.

6. The solar cell module according to claim 3, a width of the rectangular hexahedron diffraction gratings is narrower than a width of the parallel horizontal diffraction gratings.

* * * * *